United States Patent [19]
Liu et al.

[11] Patent Number: 5,610,086
[45] Date of Patent: Mar. 11, 1997

[54] METHOD OF MAKING AN ALPSB/INP SINGLE HETEROJUNCTION BIPOLAR TRANSISTOR ON INP SUBSTRATE FOR HIGH-SPEED, HIGH-POWER APPLICATIONS

[75] Inventors: Takyiu Liu; Chanh Nguyen, both of Newbury Park; Mehran Matloubian, Encino, all of Calif.

[73] Assignee: Hughes Aircraft Company, Los Angeles, Calif.

[21] Appl. No.: 468,584

[22] Filed: Jun. 6, 1995

[51] Int. Cl.$^6$ .................................................. H01L 21/265
[52] U.S. Cl. ............................ 437/31; 437/126; 437/133; 148/DIG. 72
[58] Field of Search ............................ 437/31, 126, 133, 437/32; 148/DIG. 72

[56] References Cited

U.S. PATENT DOCUMENTS 4,695,857  9/1987  Baba et al. ..................... 148/DIG. 160
4,792,832  12/1988 Baba et al. ..................... 437/133
4,833,101  5/1989  Fuji .................................. 437/110
5,017,517  5/1991  Mochizuki et al. ............. 148/DIG. 5
5,407,491  4/1995  Freundlich et al. ............ 437/107

OTHER PUBLICATIONS

Chris G. Van de Walle, "Band Lineups and Defomration Potentials in the Model–Solid Theory", Am. Phys. Soc., Phys. Rev. B., vol. 39, No. 3, pp. 1871–1883, Jan. 1989.

*Primary Examiner*—Tuan H. Nguyen
*Attorney, Agent, or Firm*—V. D. Duraiswamy; W. K. Denson-Low

[57] ABSTRACT

An epitaxial structure and method of manufacture for a single heterojunction bipolar transistor capable of being utilized in high-speed and high-power applications. Preferably, the epitaxial structure comprises an N-type collector made from InP, a P-type base made from InP, and an N-type emitter made from a semiconductor material of approximately 39 mole percent AlP and approximately 61 mole percent Sb.

12 Claims, 1 Drawing Sheet

5,610,086

METHOD OF MAKING AN ALPSB/INP SINGLE HETEROJUNCTION BIPOLAR TRANSISTOR ON INP SUBSTRATE FOR HIGH-SPEED, HIGH-POWER APPLICATIONS

BACKGROUND OF THE INVENTION

1. Field of the Invention

The present invention relates in general to the manufacture of heterojunction bipolar transistors (HBT). More particularly, it relates to a novel material system and epitaxial structure for a single heterojunction bipolar transistor (SHBT) having at least one AlPSb/InP layer and an InP substrate, and capable of being used in high-speed high-power applications.

2. Description of the Related Art

A HBT is a known type of semiconductor transistor employing an emitter made from a wide-gap semiconductor, a base made from a narrow-gap semiconductor, and a collector made from either a narrow bandgap or wide bandgap semiconductor. High-speed, high-power HBTs are used in a variety of electronic devices such as power amplifiers, low-noise amplifiers, and high-frequency switches.

One particular type of HBT is the double heterojunction bipolar transistor (DHBT). A DHBT is usually intended for power applications, because the collector is a wide bandgap semiconductor. A conventional DHBT (NPN-type) might include a Si-doped AlInAs layer as its wide-gap N-emitter, a Be- or C-doped GaInAs layer as its P-base, a lightly Si-doped InP layer as its N-collector, an InP substrate, a first grading layer between the base and emitter (B/E grading layer), and a second grading layer between the base and collector (B/C grading layer) The high-power capabilities of the typical DHBT are provided by the InP collector since it provides a much higher breakdown voltage than an HBT with a narrow bandgap semiconductor. For high-speed, high-power applications, the use of InP as a collector provides high saturation velocity, large bandgap, and large breakdown voltages. The high saturation velocity translates into a short collector transit time, and the large bandgap and large breakdown field translates into high breakdown voltages, $BV_{CBO}$ and $BV_{CEO}$.

Although DHBTs provide suitable power performance, they have the disadvantage of containing conduction band discontinuity between the GaInAs base layer and the InP collector layer (B/C interface) which blocks the flow of electrons from the base to the collector resulting in poor output characteristics. For example, the conduction band discontinuity at the B/C interface of a GaInAs base and a InP collector is about 0.25 eV for gas-source molecular beam epitaxy grown materials. This necessitates the use of several elaborate grading layers and bandgap engineering between the GaInAs base and the InP collector, both of which are difficult to implement. Additionally, because AlInAs, a conventional emitter, has about the same bandgap as InP, AlInAs could not be used as an emitter in a DHBT employing InP as the base and the collector.

Another type of HBT, known as a single heterojunction bipolar transistor (SHBT), avoids the above-described problems by not utilizing InP in its collector. However, this results in a SHBT construction that provides high-speed but does not typically also provide the high-power capabilities that result from using InP as the collector layer. For example, a conventional SHBT may employ Si-doped AlInAs as the wide-gap N-emitter, Be-doped GaInAs as the P-base, Si-doped GaInAs as the N-collector, an InP substrate, and grading layer between the emitter and base. Because the intrinsic speed of the transistor is determined by the transit time through the base and collector, a high-speed transistor employs materials with high electron mobility and saturation velocity in both the base and the collector. GaInAs is a very high-speed material because its bandgap is low. However, GaInAs is a low breakdown voltage material, so transistors employing GaInAs as a collector cannot deliver high-power performance.

Thus, it would be beneficial to provide a material system and epitaxial structure for a SHBT that allows it to incorporate InP in both the base and collector, thereby allowing the SHBT to provide both high-speed and high-power capabilities. At the same time, an emitter with a bandgap larger than InP is desirable to improve the emitter efficiency and the current gain. In addition, an emitter employing a chemically stable material lattice-matched to InP is desirable for ease of growth.

SUMMARY OF THE INVENTION

The present invention provides a material system and epitaxial structure for a single heterojunction bipolar transistor that incorporates InP in both the base and collector, thereby allowing the SHBT to provide both high-speed and high-power capabilities. In accordance with a preferred embodiment of the present invention, the novel material system which results in a SHBT on an InP semiconductive support for high-speed and high-power applications, includes a collector made from doped semiconductor of InP, a base made from doped semiconductor also of InP, and an emitter made from a doped semiconductor of $AlP_{0.39}Sb_{0.61}$. Preferably, the semiconductor materials are doped N-type for the collector, P-type for the base, and N-type for the emitter. Alternatively, the semiconductor materials could be doped P-type for the collector, N-type for the base, and P-type for the emitter.

The present invention also encompasses a novel method of making an epitaxial structure for a single heterojunction bipolar transistor. The method steps comprise providing a collector over a semiconductive support, the collector made from a doped semiconductor material including InP, and the semiconductive support made from a semiconductor material also including InP. A base is provided over the collector, the base being made from a doped semiconductor material also including InP. An emitter is provided over the base, the emitter being made from a doped semiconductor material including $AlP_{0.39}Sb_{0.61}$.

Because the method and material system of the present invention employs $AlP_{0.39}Sb_{0.61}$, which is lattice-matched to InP, the growth of the epitaxial structure can be easily implemented because no critical layer thickness consideration is necessary. Furthermore, the use of $AlP_{0.39}Sb_{0.61}$ as the emitter allows InP to be used as both the base and the collector in a SHBT transistor structure because AlPSb has a much wider bandgap than InP. Although a $AlP_{0.39}Sb_{0.61}$/InP emitter/base grading layer is necessary because the valence band maximum of InP is below that of $AlP_{0.39}Sb_{0.61}$, the design and growth of the emitter/base interface in the preferred embodiment of the present invention is much more lenient when compared with a base/collector grading layer, which is absent in the SHBT of the present invention, but is necessary with a more conventional AlInAs/GaInAs/InP DHBT. Moreover, because InP has an excellent high-field saturation velocity, superior transport in the collector is expected which translates into a short collector transit time and therefore high current gain cutoff frequency ($f_T$) and high maximum frequency oscillation ($f_{max}$). A high breakdown voltage is also expected due to the wide bandgap of InP and the large maximum allowable breakdown field in the pn homojunction of the InP base/collector interface.

The invention itself, together with further objects and attendant advantages, will best be understood by reference to the following detailed description, taken in conjunction with the accompanying drawings.

DESCRIPTION OF THE PREFERRED EMBODIMENTS

Figure 1:
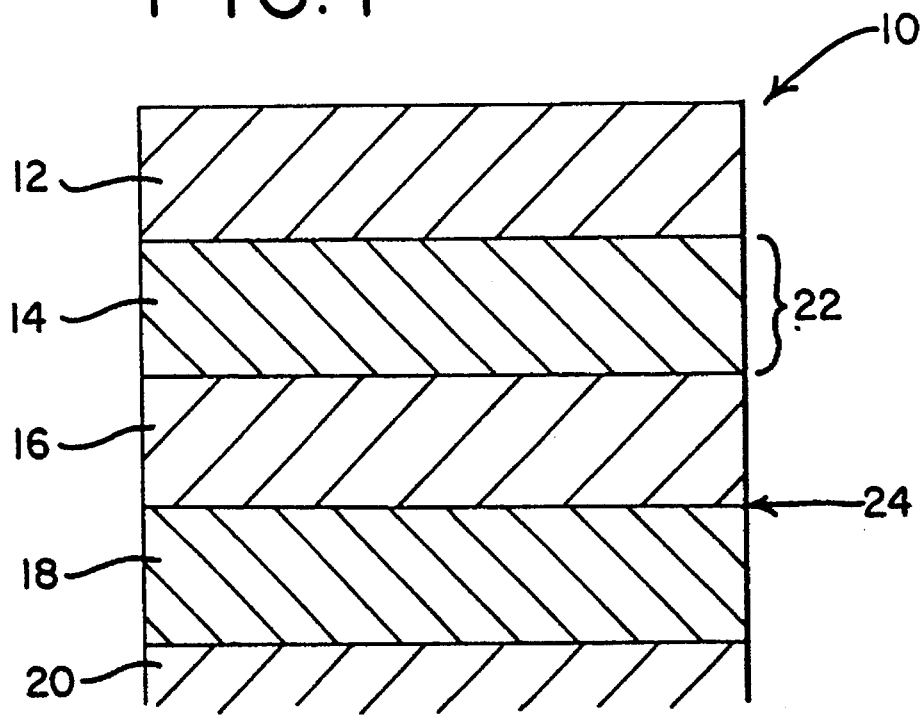
FIG. 1 is a schematic diagram of a cross section of an epitaxial structure embodying the present invention.

The present invention relates to a novel material system and epitaxial structure for a high-speed and high-power SHBT. FIG. 1 illustrates a epitaxial structure 10 embodying the device and method of the present invention. As shown in FIG. 1, the epitaxial structure 10 employs an emitter 12, an E/B grading layer 14, a base 16, a collector 18, and a semiconductive support 20.

In the illustrated epitaxial structure 10, the emitter 12 is a semiconductor comprising $AlP_{0.39}Sb_{0.61}$, the base 16 is a semiconductor comprising InP, the collector 18 is a semiconductor comprising InP. The semiconductive support 20 comprises a substrate and/or a supporting layer comprising a semiconductor material. For example, the semiconductive support 20 may be a substrate comprising InP or a supporting layer comprising InP.

The epitaxial structure 10 shown in FIG. 1 can be for an NPN transistor, wherein the emitter 12 and collector 18 comprises an N-dopant (N-type dopant) and the base 16 comprises a P-dopant (P-type dopant). The N-dopant in the emitter 12 is preferably an element from Group VI of the periodic table. Thus the N-dopants for the AlPSb can be, for example, Te, S and Se. Te is the more preferred dopant for AlPSb. The P-dopant in the base 16 can be any conventional P-dopant for InP. For example, the P-dopant can be selected from Group II elements of the periodic table. Thus the P-dopants can be, for example, Be, Mg and Zn. The preferred P-dopant is Be. The N-dopant in the collector 18 can be any conventional N-dopant for InP. For example, the N-dopant can be selected from a group consisting essentially of Si (a group IV element) and elements from Group VI of the periodic table. Thus the N-dopants can be, for example, Te, Si, S and Se. Si is the preferred dopant for InP.

Alternatively, the epitaxial structure 10 can be for a PNP transistor, wherein the emitter 12 and the collector 18 comprise a P-dopant and the base 16 comprises an N-dopant. For example, the P-dopant in the emitter 12 and collector 18 can be selected from Group II elements from the periodic table. Thus the P-dopant can be Be, Mg and Zn. Be is the preferred P-dopant. The N-dopant for the base 16 can be an element selected from the group consisting essentially of Si and Group VI elements from the periodic table. Thus the N-dopant can be Si, Te, S and Se. The preferred N-dopant is Si. NPN is the preferred structure for a transistor.

The growth of the emitter 12 can be achieved by conventional epitaxial growth techniques which supply sources of phosphorous and antimony. For example, using Gas-source Molecular Beam Epitaxy, an epilayer comprising $AlP_{0.39}Sb_{0.61}$ can be grown from a $PH_3$ gas source equipped with a solid-source antimony. In addition, the emitter 12 can be grown from an AlP/AlSb superlattice to mimic an $AlP_{0.39}Sb_{0.61}$ epilayer. For example, an emitter can be grown in accordance with the superlattice growth method, comprising a superlattice with a period of about 30 Å and a proper duty cycle, namely about 11.7 Å AlP and about 18.3 Å AlSb, which will mimic the electronic properties of $AlP_{0.39}Sb_{0.61}$. Preferably, the AlP/AlSb superlattice has a period measurement between about 15 Å and about 50 Å.

The more preferred method of growing the emitter 12 is growth of an $AlP_{0.39}Sb_{0.61}$ epilayer from a phosphine ($PH_3$) gas source, and solid-source of antimony. The flow of phosphine gas can be controlled with a mass flow controller. A thermal cracker at about 800° C. to about 1000° C. cracks phosphine gas into (mainly) dimers before incorporating into the growth front of the layers. As for the antimony, a well established approach is to generate tetramers and dimers of antimony by thermal means (in an effusion cell), in the same way arsenic is generated in a more conventional solid-source MBE growth chamber. High-quality antimonides (GaSb and AlSb) have been achieved worldwide with or without a thermal cracker. Yet, unlike the arsenic, antimony flux can be shuttered very abruptly. Thus, high quality, abrupt interfaces can be grown.

Conventional epitaxial growth processes can be used to make the epitaxial structure 10 of the present invention. The preferred processes include gas-source molecular beam epitaxy (GSMBE), chemical beam epitaxy (CBE), and metalorganic chemical vapor deposition (MOCVD), the latter process also known as metalorganic vapor phase epitaxy (MOVPE). The most preferred processes are GSMBE and CBE.

AlPSb with about 39 mole percent AlP, that is $AlP_{0.39}Sb_{0.61}$, is essentially lattice-matched to InP per Vegard's law. Because the material system only employs AlPSb which is essentially lattice-matched to InP, the growth of the epitaxial structure will be relatively straightforward because no critical layer thickness consideration is necessary. In addition, $AlP_{0.39}Sb_{0.61}$ is a chemically stable material which does not decompose when exposed to the atmosphere at temperatures well above the operating temperature of a device. Typically, the operating temperature of a device is below about 250° C.

Calculations have been performed based on the self-consistent ab initio band structure methodology of Van de Walle's model solid approach (reference: C.G. Van de Walle, "Band lineups and deformation potentials in the model-solid theory", Physical Review B, Vol. 39, pages 1871–1881, January 1989) on the material system AlPSb (39% AlP) and InP. Based on these calculations, a type II staggered lineup can be expected between $AlP_{0.39}Sb_{0.61}$ and InP.

Figure 2:
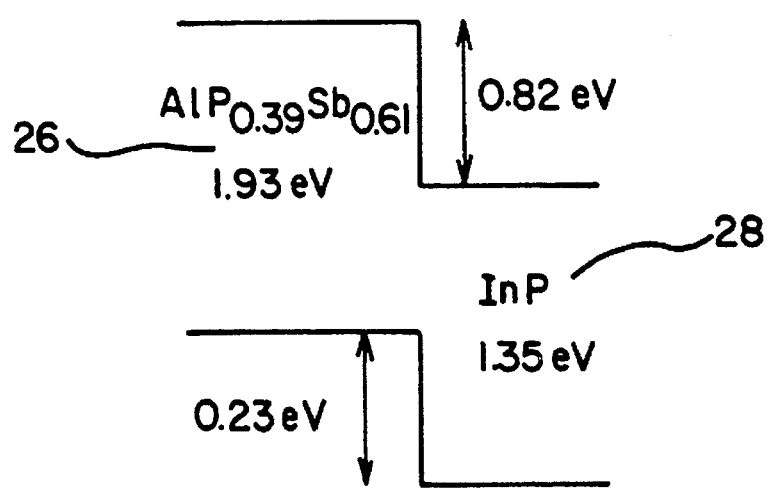
FIG. 2 is a schematic diagram of the band lineup of the epitaxial structure shown in FIG. 1.

FIG. 2 shows the band lineup between $AlP_{0.39}Sb_{0.61}$ and InP in the system shown in FIG. 1. As shown in FIG. 2, the material $AlP_{0.39}Sb_{0.61}$ 26 has a bandgap of about 1.93 eV, whereas the material InP 28 has a bandgap of about 1.35 eV. In particular, the conduction band minimum of InP 28 is about 0.82 eV below that of $AlP_{0.39}Sb_{0.61}$ 26 while the valence band maximum of InP 28 is about 0.23 eV below that of $AlP_{0.39}Sb_{0.61}$ 26.

The use of $AlP_{0.39}Sb_{0.61}$ as the emitter 12 allows one to use InP as both the base 16 and the collector 18 in the SHBT

10. Because the valence band maximum of InP is actually below that of $AlP_{0.39}Sb_{0.61}$ 26, a simple abrupt $AlP_{0.39}Sb_{0.61}$/InP E/B interface cannot be used. Thus, it is necessary to grade the E/B interface 22 by providing the grading layer 14 in order to use the wide-gap $AlP_{0.39}Sb_{0.61}$ as the emitter 12. Because the E/B interface 22 is forward-biased, the design and growth of the E/B interface 22 is much more lenient when compared with a base/collector (B/C) grading layer (which is absent in the SHBT 10 of the present invention, but is necessary with a more conventional AlInAs/GaInAs/InP DHBT). The bandgap difference, $\Delta$ Eg (bandgap of $AlP_{0.39}Sb_{0.61}$ minus that of InP) has a large value of about 0.58 eV, which will provide high emitter efficiency.

Because InP has an excellent high-field saturation velocity, superb transport in the collector 18 is expected which translates into a short collector transit time and therefore high current gain cutoff frequency ($f_T$) and high maximum frequency oscillation ($f_{max}$). A high breakdown voltage is also expected due to the wide bandgap of InP and the large maximum allowable breakdown field in the pn homojunction of the InP B/C interface 24.

Applications of a SHBT resulting from the epitaxial structure of the present invention would include, for example, devices such as analog-to-digital converters or very-high-frequency switch, especially those operating above about 200 MHz at above about 200 volts. A further application of such SHBT includes, for example, a power device operating from about 4 GHz to about 20 GHz. For example, the SHBT can be a component of a power amplifier operating in the radar frequency range, especially devices that operate in a frequency range from about 7 to about 11 GHz, at a power of above about 8 Watts, at a gain of above about 9 dB, at an efficiency of above about 50% (wherein the power amplifier has a heterojunction bipolar transistor breakdown voltage of above about 25 volts at an open-circuit collector-base), a maximum frequency oscillation above about 90 GHz and a power cell of about 2 Watts at a power-added efficiency of about 50 percent.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A method of making an epitaxial structure for a single heterojunction bipolar transistor, the steps comprising:

(a) providing a collector over a semiconductive support, said collector comprising a first semiconductor material;

(b) providing a base over said collector, said base comprising a second semiconductor material; and (c) providing an emitter over said base, said emitter comprising about 39 mole percent AlP and about 61 mole percent Sb.

2. The method of claim 1 wherein said first semiconductor material comprises InP.

3. The method of claim 1 wherein said second semiconductor material comprises InP.

4. The method of claim 1 wherein said first semiconductor material and said second semiconductor material comprise InP.

5. The method of claim 1 wherein said semiconductive support comprises an InP substrate.

6. The method of claim 4 wherein said semiconductive support comprises an InP substrate.

7. The method of claim 1 wherein said first semiconductor material comprises an N-type dopant, said second semiconductor material comprises a P-type dopant, and said collector comprises an N-type dopant.

8. The method of claim 4 wherein said first semiconductor material comprises an N-type dopant, said second semiconductor material comprises a P-type dopant, and said collector comprises an N-type dopant.

9. The method of claim 1 wherein:

said collector is provided over said semiconductive support by growing said collector on said semiconductive support in a growth chamber;

said base is provided over said collector by growing said base on said collector in said growth chamber; and said emitter is provided over said base by growing said emitter on said base in said growth chamber.

10. The method of claim 9 wherein said growth chamber is adapted for growth of expitaxial AlPSb from an AlP/AlSb superlattice.

11. The method of claim 9 wherein said growth chamber is adapted for growth of films from a phosphine gas source and a solid-source antimony.

12. The method of claim 9 wherein said growth chamber is part of an apparatus selected from the group consisting essentially of gas-source molecular beam epitaxy, chemical beam epitaxy and metalorganic chemical vapor deposition.

\* \* \* \* \*